(12) United States Patent
Hermes et al.

(10) Patent No.: US 8,895,651 B2
(45) Date of Patent: Nov. 25, 2014

(54) COMPOSITION FOR PRINTING A SEED LAYER AND PROCESS FOR PRODUCING CONDUCTOR TRACKS

(75) Inventors: Stephan Hermes, Bad Dürkheim (DE); Sorin Ivanovici, Heidelberg (DE)

(73) Assignee: BASF SE, Ludwigshafen (DE)

( * ) Notice: Subject to any disclaimer, the term of this patent is extended or adjusted under 35 U.S.C. 154(b) by 458 days.

(21) Appl. No.: 13/027,706

(22) Filed: Feb. 15, 2011

(65) Prior Publication Data

US 2011/0201190 A1 Aug. 18, 2011

Related U.S. Application Data

(60) Provisional application No. 61/304,849, filed on Feb. 16, 2010.

(51) Int. Cl.
| | |
|---|---|
| *C08K 5/07* | (2006.01) |
| *C23C 18/20* | (2006.01) |
| *C25D 5/54* | (2006.01) |
| *C25D 5/02* | (2006.01) |
| *C23C 18/18* | (2006.01) |
| *H01L 21/768* | (2006.01) |

(52) U.S. Cl.
CPC .............. *C25D 5/02* (2013.01); *C23C 18/2066* (2013.01); *C25D 5/54* (2013.01); *H01L 21/76874* (2013.01); *H01L 21/76873* (2013.01); *C23C 18/1882* (2013.01)
USPC ............ 524/356; 524/379; 524/495; 524/496

(58) Field of Classification Search
USPC .................................. 524/356, 379, 495, 496
See application file for complete search history.

(56) References Cited

U.S. PATENT DOCUMENTS

| | | | |
|---|---|---|---|
| 5,725,807 A | 3/1998 | Thorn et al. | |
| 6,177,151 B1 | 1/2001 | Chrisey et al. | |
| 2008/0281014 A1* | 11/2008 | Momose et al. ................. 522/71 |
| 2010/0009094 A1 | 1/2010 | Lochtman et al. | |
| 2011/0014492 A1 | 1/2011 | Joshi et al. | |
| 2011/0143107 A1 | 6/2011 | Steinig-Nowakowski et al. | |

FOREIGN PATENT DOCUMENTS

| | | |
|---|---|---|
| CN | 101584258 A | 11/2009 |
| WO | WO 2008/015167 A1 | 2/2008 |
| WO | WO 2008/142070 A2 | 11/2008 |
| WO | WO 2009/112573 A2 | 9/2009 |

OTHER PUBLICATIONS

Encyclopedia of Polymer Science and Technology, J. Wiley & Son (1966), vol. 5, pp. 816-818.
"Emulsion Polymerisation and Emulsion Polymers", P. Lovell and M. El-Aasser, Wiley & Sons (1997) pp. 224-226.
Werner Jillek, Gustl Keller, Handbuch der Leiterplattentechnik [Handbook of Printed Circuit Board Technology} Eugen G. Leuze Verlag, 2003, vol. 4, pp. 332-352.
International Search report PCT/182011/050577—Jun. 16, 2011.
U.S. Appl. No. 13/380,259, filed Feb. 16, 2012, Jaeger et al.
U.S. Appl. No. 13/394,011, filed Mar. 2, 2012, Jaeger et al.
U.S. Appl. No. 13/394,008, filed Mar. 2, 2012, Jaeger et al.
U.S. Appl. No. 61/286,044, filed Dec. 14, 2009, Steinig-Nowakowski et al.

* cited by examiner

*Primary Examiner* — Edward Cain
(74) *Attorney, Agent, or Firm* — Drinker Biddle & Reath LLP

(57) ABSTRACT

The invention relates to a composition for printing a seed layer for electrodeposition or electroless deposition of a metal for the production of full-area or structured metallic surfaces on a substrate, comprising 0.1 to 6% by weight of electrolessly and/or electrolytically coatable particles, 40 to 98.8% by weight of at least one solvent, 0 to 15% by weight of a crosslinker, 0.1 to 6% by weight of at least one dispersing additive, 0 to 5% by weight of at least one further additive and 1 to 20% by weight of at least one polymer, said at least one polymer being in the form of a dispersion. The invention further relates to a process for producing full-area or structured metallic surfaces on a substrate, and to a use of the process.

14 Claims, No Drawings

COMPOSITION FOR PRINTING A SEED LAYER AND PROCESS FOR PRODUCING CONDUCTOR TRACKS

CROSS-REFERENCE TO RELATED APPLICATIONS

This Application claims the benefit of U.S. Provisional Application 61/304,849 filed on Feb. 16, 2010, the contents of which are incorporated herein in its entirety.

FIELD OF THE INVENTION

The invention relates to a composition for printing a seed layer for electrodeposition or electroless deposition of a metal for the production of full-area or structured metallic surfaces on a substrate. The invention further relates to a process for producing full-area or structured metallic surfaces on a substrate.

BACKGROUND

The inventive composition and the process are suitable, for example, for producing conductor tracks on printed circuit boards, RFID antennas, transponder antennas or other antenna structures, chip card modules, flat cables, seat heaters, film conductors, conductor tracks on solar cells or for LCD or plasma visual display units, 3D molded interconnect devices, integrated circuits, resistive, capacitative or inductive elements, diodes, transistors, sensors, actuators, optical components, receiver/transmitter devices, decorative or functional surfaces on products which are used for shielding of electromagnetic radiation, for conduction of heat or as packaging, thin metal foils or single- or double-sidedly laminated polymer supports.

In known processes for producing structural or full-area metallic surfaces on a substrate, it is known, for example, first to transfer electrically conductive particles present in a matrix material to the substrate. The transfer can be effected by any printing process. U.S. Pat. No. 6,177,151 discloses, for example, transferring the electrically conductive particles present in the matrix material by using a laser printing process. The laser volatilizes the matrix material, such that the electrically conductive particles are transferred to the substrate. The electrically conductive particles and the matrix material at first form a solid coating on the support.

In addition to the use of laser printing processes, however, the use of screen printing processes in order to produce correspondingly structured surfaces is also common. However, a disadvantage of the known processes is that the particles present in the matrix material form a comparatively dense surface, and the metallic layer which is deposited thereon adheres only at the surface. This can lead to flaking of the metallic layer, especially in the event of temperature variations. Especially when carbon particles are used as the particles which are to be coated electrolessly and/or electrolytically, there is not sufficient adhesion with the processes and compositions known from the prior art for the printed layer.

BRIEF SUMMARY

It is therefore an object of the present invention to provide a composition for printing a seed layer for electrodeposition or electroless deposition of a metal for the production of full-area or structured metallic surfaces on a substrate, which allows stable adhesion of the metal deposited thereon.

It is a further object of the present invention to provide a process for producing such full-area or structured metallic surfaces on a substrate.

The object is achieved by a composition for printing a seed layer for electrodeposition or electroless deposition of a metal for the production of full-area or structured metallic surfaces on a substrate, comprising 0.1 to 6% by weight of electrolessly and/or electrolytically coatable particles, 40 to 98.8% by weight of at least one solvent, 0 to 15% by weight of a crosslinker, 0.1 to 6% by weight of at least one dispersing additive, 0 to 5% by weight of at least one further additive and 1 to 20% by weight of at least one polymer, said at least one polymer being in the form of a dispersion.

DETAILED DESCRIPTION OF THE PREFERRED EMBODIMENTS

The inventive composition forms a porous seed layer on the substrate to be coated, such that there is stable adhesion of the metallic surface on the seed layer. This is attributable especially to the fact that the metal of the metallic surface penetrates into the pores of the seed layer, thus resulting, in addition to the chemical adhesion, in mechanical interlinkage between seed layer and the metal of the metallic surface.

In order to obtain particularly good adhesion of seed layer and the metal which forms the metallic surface, it is especially preferred when the electrolessly and/or electrolytically coatable particles have, in at least one direction, a dimension which differs from the dimension in the other directions. As a result of the shape of the electrolessly and/or electrolytically coatable particles, there is no dense packing of the seed layer, and cavities instead form between the particles, which the metal for the surface can enter. In this way, a further improvement in interlinkage between seed layer and metallic surface is achieved.

The electrolessly and/or electrolytically coatable particles present in the composition are electrically conductive especially in the case of use of the composition for producing conductor tracks on printed circuit boards. By virtue of the electrical conductivity of the electrolessly and/or electrolytically coatable particles, the conductivity of the conductor tracks on the printed circuit board is improved overall over a thin metal layer which is deposited on nonconductive particles.

In a particularly preferred embodiment, the electrolessly and/or electrolytically coatable particles are carbon nanotubes or graphenes. The use of carbon nanotubes or graphenes gives rise to a structure of the seed layer in which the individual carbon nanotubes or graphenes are matted together, thus forming a kind of fleece structure. The mechanical interlinkage of the carbon nanotubes or graphenes achieves particularly stable adhesion of seed layer and metal of the metallic surface.

The proportion of electrolessly and/or electrolytically coatable particles in the composition is, in accordance with the invention, in the range from 0.1 to 6% by weight. The proportion of electrolessly and/or electrolytically coatable particles is preferably in the range from 0.5 to 2% by weight and especially in the range from 1 to 1.5% by weight.

According to the invention, the at least one polymer present in the composition is not soluble in the solvent. The polymer is therefore in the form of small particles dispersed in the solvent. Owing to the presence of the polymer in the form of small particles in the solvent, the drying of the seed layer after the application by printing does not give rise to a homogeneous layer, and there is instead formation of the pores needed for interlinkage with the metal of the metallic surface.

Examples of suitable solvents in which the at least one polymer is not soluble include water, hydrocarbons such as pentane, hexane, heptane or octane, and esters, ketones, aldehydes, alcohols or glycols, and mixtures thereof. The solvent is more preferably water.

The proportion of solvent in the composition is in the range from 40 to 98.8% by weight. The proportion of solvent is preferably in the range from 72 to 93.6% by weight and especially in the range from 83.5 to 91.4% by weight.

Depending on the solvent used, different polymers which are not soluble in the solvent can be used. The proportion of polymer in the composition is in the range from 1 to 20% by weight, preferably in the range from 4 to 10% by weight and especially in the range from 5 to 8% by weight.

Examples of suitable polymers include acrylonitrile-butadiene-styrene (ABS); acrylonitrile-styrene-acrylate (ASA); acrylated acrylates; alkyl resins; alkylvinyl acetates; alkylene-vinyl acetate copolymers, especially methylene-vinyl acetate, ethylene-vinyl acetate, butylene-vinyl acetate; alkylene-vinyl chloride copolymers; amino resins; aldehyde and ketone resins; cellulose and cellulose derivatives, in particular hydroxyalkylcellulose, cellulose esters, such as acetates, propionates, butyrates, carboxyalkylcelluloses, cellulose nitrate; epoxy acrylates; epoxy resins; modified epoxy resins, for example bifunctional or polyfunctional bisphenol A or bisphenol F resins, epoxy novolak resins, brominated epoxy resins, cycloaliphatic epoxy resins; aliphatic epoxy resins, glycidyl ethers, vinyl ethers, ethylene-acrylic acid copolymers; hydrocarbon resins; transparent ABS comprising acrylate units (MABS); melamine resins; maleic anhydride copolymers; methacrylates; natural rubber; synthetic rubber; chlorinated rubber; natural resins; rosins; shellac; phenolic resins; polyesters; polyester resins such as phenyl ester resins; polysulfones; polyether sulf ones; polyamides; polyimides; polyanilines; polypyrroles; polybutylene terephthalate (PBT); polycarbonate (for example Makrolon® from Bayer AG); polyester acrylates; polyether acrylates; polyethylene; polyethylenethiophenes; polyethylene naphthalates; polyethylene terephthalate (PET); polyethylene terephthalate-glycol (PETG); polypropylene (PP); polymethyl methacrylate (PMMA); polyphenylene oxide (PRO); polystyrenes (PS), polytetrafluoroethylene (PTFE); polytetrahydrofuran; polyethers (for example polyethylene glycol, polypropylene glycol), polyvinyl compounds, in particular polyvinyl chloride (PVC), PVC copolymers, polyvinylidene chloride (PVdC), polyvinyl acetate and copolymers thereof, optionally partially hydrolyzed polyvinyl alcohol, polyvinyl acetals, polyvinyl acetates, polyvinylpyrrolidone, polyvinyl ethers, polyvinyl acrylates and methacrylates in solution and as dispersion and also copolymers thereof, polyacrylic esters and polystyrene copolymers; polystyrene (impact-modified or not impact-modified); polyurethanes (PUR), uncrosslinked or isocyanate-crosslinked; polyurethane acrylates; styrene-acrylic copolymers; styrene-butadiene block copolymers (for example Styroflex® and Styrolux® from BASF SE, K-Resin™ from CPC); proteins such as casein; SIS; triazine resin, bismaleimide-triazine resin (BT), cyanate ester resin (CE), allylated polyphenylene ether (APPE). It is also possible to use mixtures of two or more polymers.

Particularly preferred polymers are acrylates, cellulose derivatives, methacrylates, methacrylate resins, melamine and amino resins, polyalkylenes, polyimides, epoxy resins, polyurethanes, polyesters, polyvinyl acetals, polyvinyl acetates, polystyrenes, polystyrene copolymers, polystyrene acrylates, styrene-butadiene block copolymers, alkylene-vinyl acetate and vinyl chloride copolymers, polyamides and copolymers thereof.

Very particularly preferred polymers are polyurethanes and polyacrylates, and copolymers thereof.

In order to be able to store and process the composition stably over a given period without precipitation of the electrolessly and/or electrolytically coatable particles and the polymer, dispersing additives are also present in the composition. The proportion of dispersing additives is in the range from 0.1 to 6% by weight, preferably in the range from 0.3 to 3% by weight and especially in the range from 0.5 to 1% by weight.

In principle, all dispersing additives known to those skilled in the art for use in dispersions and described in the prior art are suitable. Preferred dispersing additives are surfactants or surfactants mixtures, for example anionic, cationic, amphoteric or nonionic surfactants. Cationic and anionic surfactants are described, for example, in "Encyclopedia of Polymer Science and Technology", J. Wiley & Son (1966), Vol. 5, pages 816-818, and in "Emulsion Polymerisation and Emulsion Polymers", editors P. Lovell and M. El-Aasser, Wiley & Sons publishers (1997), pages 224-226. However, it is also possible to use polymers which have pigment-affinitive anchor groups and are known to those skilled in the art as dispersants.

In addition to the polymer dispersion, it is also possible for a crosslinker to be present in the composition. This improves the film properties and affects adhesion, chemical resistance and mechanical strength. The proportion of crosslinker in the dispersion is, for example, from 0 to 15% by weight, preferably in the range from 1.5 to 10% by weight and especially in the range from 2 to 5% by weight.

Examples of suitable crosslinkers include (poly)isocyanates, (poly)aziridines, carbodiimides, MF (melamine-formaldehyde) resins, MF crosslinkers, metal complexes and adipic bishydrazides. Particular preference is given to MF crosslinkers.

In addition to the dispersing additives, it is also possible for further additives to be present in the composition. The proportion of further additives is in the range from 0 to 5% by weight, preferably in the range from 0.1 to 3% by weight and especially in the range from 0.1 to 1% by weight.

An example of an additive present may be a filler component. This may consist of one or more fillers. For instance, the filler component of the composition may comprise fibrous, layered or particulate fillers or mixtures thereof. They are preferably commercially available products, for example mineral fillers.

In addition, it is possible to use fillers or reinforcers such as glass powder, mineral fibers, whiskers, aluminum hydroxide, metal oxides such as aluminum oxide or iron oxide, mica, quartz flour, calcium carbonate, barium sulfate, titanium dioxide or wollastonite.

Further examples of usable additives include thixotropic agents such as silica, silicates, for example Aerosils or bentonites, or organic thixotropic agents and thickeners, for example polyacrylic acid, polyurethanes, hydrogenated castor oil, dyes, fatty acids, fatty acid amides, plasticizers, wetting agents, defoamers, lubricants, desiccants, photoinitiators, complexing agents, waxes, pigments or conductive polymer particles.

Further additives present in the composition may also be processing aids and stabilizers, such as UV stabilizers, lubricants, corrosion inhibiters and flame retardants.

The proportions by mass of the individual components present in the composition are each based on the total mass of the composition.

The object is also achieved by a process for producing full-area or structured metallic surfaces on a substrate, which comprises the following steps:
(a) printing the above-described composition onto the substrate according to a given pattern,
(b) drying and/or curing the composition to form a seed layer,
(c) applying a metal layer to the composition by electroless deposition and/or electrodeposition of a metal to the seed layer to produce the full-area or structured metallic surface.

Examples of suitable substrates to which the electrically conductive surface is applied are rigid or flexible substrates. The substrate is preferably not electrically conductive. This means that the specific resistivity is more than $10^9$ ohm×cm. Suitable substrates are, for example, reinforced or unreinforced polymers as typically used for printed circuit boards. Suitable polymers are epoxy resins, or modified epoxy resins, for example bifunctional or polyfunctional bisphenol A or bisphenol F resins, epoxy novolac resins, brominated epoxy resins, aramide-reinforced or glass fiber-reinforced or paper-reinforced epoxy resins (for example FR4), glass fiber-reinforced polymers, liquid crystal polymers (LCP), polyphenylene sulfides (PPS), polyoxymethylenes (POM), polyaryl ether ketones (PAEK), polyether ether ketones (PEEK), polyamides (PA), polycarbonates (PC), polybutylene terephthalates (PBT), polyethylene terephthalates (PET), polyimides (PI), polyimide resins, cyanate esters, bismaleimide-triazine resins, nylon, vinyl ester resins, polyesters, polyester resins, polyanilines, phenol resins, polypyrrols, polyethylene naphthalate (PEN), polymethyl methacrylate, polyethylenedioxythiophenes, phenol resin-coated aramid paper, polytetrafluoroethylene (PTFE), melamine resins, silicone resins, fluoro resins, allylated polyphenylene ethers (APPE), polyether imides (PEI), polyphenylene oxides (PPO), polypropylenes (PP), polyethylenes (PE), polysulfones (PSU), polyether sulfones (PES), polyarylamides (FAA), polyvinyl chlorides (PVC), polystyrenes (PS), acrylonitrile-butadiene-styrenes (ABS), acrylonitrile-styrene-acrylates (ASA), styrene-acrylonitriles (SAN), and also mixtures (blends) of two or more of the abovementioned polymers which may be present in a wide variety of different forms. The substrates may have additives known to those skilled in the art, for example flame retardants.

In principle, the substrates used may also be all polymers which are present in the composition and have been listed above. Also suitable are other substrates likewise customary in the printed circuit board industry.

Further suitable substrates are composite materials, foam-type polymers, Styropor®, Styrodur®, polyurethanes (PU), ceramic surfaces, textiles, paperboard, cardboard, paper, polymer-coated paper, wood, mineral materials, silicon, glass, plant tissue and animal tissue.

In a first step, the above-described composition is printed onto the substrate according to a given pattern. The composition can be printed on by any desired printing process known to those skilled in the art. Suitable printing process are, for example, offset printing processes, laser printing processes, flexographic printing processes, gravure printing processes, screen printing processes, pad printing processes and inkjet printing processes.

Particular preference is given to printing the composition on by screen printing processes and gravure printing processes.

After it has been printed on, the composition is dried and/or cured to form a seed layer. The composition can be dried and/or cured under ambient conditions or else at elevated temperature. To form the seed layer, the composition is preferably dried and/or cured at elevated temperatures. The temperature at which the composition is dried and/or cured is preferably in the range from 30 to 200° C., preferably in the range from 50 to 160° C., more preferably in the range from 60 to 120° C.

In addition to the use of an elevated temperature at which the composition is dried to form the seed layer, it is also possible to partly cure the composition. Depending on the polymer used and crosslinker used, this is accomplished, for example, by reaction of heat, light, for example UV radiation or visible light, and/or radiation, for example infrared radiation, electron beams, gamma radiation, X-radiation or microwaves. To trigger the curing reaction, it may be necessary to add a suitable activator. It is also possible to achieve curing by combination of different methods, for example by combination of UV radiation and heat. The combination of the curing processes may be performed simultaneously or successively. For example, the UV radiation can at first only partly cure the composition to form the seed layer, such that the structures formed are not destroyed by free flow. Thereafter, thermal action can cure the seed layer. The thermal action may directly follow the UV curing and/or the electrolytic metallization.

In order to obtain improved adhesion of the composition on the substrate, it is also possible to apply a primer to the substrate before the seed layer is printed on. In this case, the primer may be applied over the whole substrate. However, it is preferred when the primer is applied to the surface of the substrate with the same structure with which the composition is also printed onto the surface. In this way, the primer is printed onto the substrate only at the sites which are also printed with the composition.

A primer can likewise be applied by a printing process, for example the same printing process with which the composition is also printed on to form the seed layer. If the primer has been applied over the whole surface, however, any desired coating process is also possible, examples being curtain coating, dipping processes or brush application of the primer.

Suitable primers are all systems known to those skilled in the art, which should be matched to the particular substrate. Examples are polyurethanes, PVC, (poly)isocyanates, PVA, polyesters, PVB and copolymers thereof, and mixtures of these types.

Depending on the planned use of the substrate provided with the metallic surface, the metal which is applied to the seed layer by electroless and/or electrolytic deposition is preferably copper, silver, gold, nickel, palladium, platinum, tin or chromium. The thicknesses of the layer applied by the electroless and/or electrolytic deposition of the metal are within customary ranges known to those skilled in the art.

Suitable electrolyte solutions which can be used for application of the metal layer by electroless and/or electrolytic deposition are known to those skilled in the art, for example, from Werner Jillek, Gustl Keller, Handbuch der Leiterplattentechnik [Handbook of Printed Circuit Board Technology], Eugen G. Leuze Verlag, 2003, Vol. 4, pages 332-352.

For electroless and/or electrolytic deposition of the metal to the seed layer to produce the full-area or structured metallic surface, it is possible to use any desired suitable process known to those skilled in the art for electroless deposition or for electrolytic deposition of a metal.

The process according to the invention is suitable, for example, for production of conductor tracks on printed circuit boards. Such printed circuit boards are, for example, those with multilayer inner and outer layers, micro-via chips on board and flexible and rigid printed circuit boards. These are incorporated, for example, into products such as computers, telephones, televisions, electrical automobile components, keyboards, radios, video, CD, CD-ROM and DVD players, games consoles, measurement and regulating instruments, sensors, electrical kitchen appliances, electric toys, etc.

The process according to the invention can also produce electrically conductive structures on flexible circuit carriers. Such flexible circuit carriers are, for example, polymer films of the materials mentioned above for the substrate, on which electrically conductive structures have been applied. The process according to the invention is also suitable for production of RFID antennas, transponder antennas or other antenna structures, chip card modules, flat cables, seat heaters, film conductors, conductor tracks in solar cells or LCD or plasma visual display units, capacitors, film capacitors, resistors, convectors, electrical fuses, or for production of electrolytically coated products in any desired form, for example single- or double-sidedly metal-laminated polymer carriers with defined layer thickness, or else for production of decorative or functional surfaces on products which are used, for example, for shielding electromagnetic radiation, for conduction of heat or as packaging. In addition, it is also possible to produce contact sites or contact pads or wires on an integrated electronic component.

The process according to the invention can equally produce integrated circuits, resistive, capacitive or inductive elements, diodes, transistors, sensors, actuators, optical components and receiver/transmitter devices.

In addition, it is also possible to produce antennas with contacts for organic electronic components and coatings on surfaces, consisting of electrically nonconductive materials for electromagnetic screening.

Use is additionally possible in the sector of flow fields of bipolar plates for use in fuel cells.

It is also possible to produce a full-area or structured electrically conductive layer for subsequent decorative metallization of moldings formed from the abovementioned electrically nonconductive substrate.

The fields of use of the process according to the invention and of the inventive composition enable stable production of metallized substrates which are themselves nonconductive, especially for use as switches and sensors, gas barriers or decorative parts, especially decorative parts for the motor vehicle, sanitary, toy, domestic and office sector, and also packaging and foils/films. The invention may also find use in the field of security printing for banknotes, credit cards, identification papers, etc. Textiles can be functionalized electrically and magnetically with the aid of the process according to the invention, for example by application of antennas, transmitters, RFID and transponder antennas, sensors, heating elements, antistatic systems (on plastics), shields, etc.

In addition, it is also possible to produce thin metal foils or single- or double-sidedly laminated polymer carriers or metallized polymer surfaces.

Preferred uses of the inventive composition and of the metallic surfaces produced by the inventive composition are those in which the products are used as a printed circuit board, RFID antenna, transponder antenna, seat heater, flat cable, contactless chip card, thin metal foil or single- or double-sidedly laminated polymer carriers, film conductors, conductor tracks on solar cells or in LCD or plasma visual display units, as integrated circuits, resistive, capacitive or inductive elements, diodes, transistors, sensors, actuators, optical components, receiver/transmitter devices, or in decorative applications, for example for packaging materials.

The invention claimed is:

1. A composition for printing a seed layer for electrodeposition or electroless deposition of a metal for the production of full-area or structured metallic surfaces on a substrate, comprising 0.1 to 6% by weight of electrolessly and/or electrolytically coatable particles, 40 to 98.8% by weight of at least one solvent, 0 to 15% by weight of a crosslinker, 0.1 to 6% by weight of at least one dispersing additive, 0 to 5% by weight of at least one further additive and 1 to 20% by weight of at least one polymer, said at least one polymer being in the form of a dispersion, wherein the at least one polymer is not soluble in the solvent and is in the form of small particles dispersed in the solvent.

2. The composition according to claim 1, wherein the electrolessly and/or electrolytically coatable particles have, in at least one direction, a dimension which differs from the dimension in the other directions.

3. The composition according to claim 1, wherein the electrolessly and/or electrolytically coatable particles are carbon nanotubes or graphenes.

4. The composition according to claim 1, wherein the solvent is selected from the group consisting of water, pentane, hexane, heptane, octane, esters, ketones, aldehydes, alcohols, glycols and mixtures thereof.

5. The composition according to claim 1, wherein the polymer is selected from the group consisting of polyurethane, polyacrylate and copolymers thereof.

6. A process for producing full-area or structured metallic surfaces on a substrate, comprising the following steps:
   (a) printing a composition according to claim 1 onto the semiconductor substrate according to a given pattern,
   (b) drying and/or curing the composition to form a seed layer,
   (c) applying a metal layer to the composition by electroless deposition and/or electrodeposition of a metal to the seed layer to produce the full-area or structured metallic surface.

7. The process according to claim 6, wherein the application of the seed layer by printing is preceded by application of a primer to the substrate.

8. The process according to claim 6, wherein the seed layer is printed onto the substrate by a screen printing process.

9. The process according to claim 6, wherein the metal is copper, silver, gold, palladium, nickel, platinum, chromium or tin.

10. The use of the process according to claim 7 for producing printed circuit boards, RFID antennas or transponder antennas.

11. The composition according to claim 1, wherein the at least one polymer is selected from the group consisting of acrylates, cellulose derivatives, methacrylates, methacrylate resins, melamine and amino resins, polyalkylenes, polyimides, epoxy resins, polyurethanes, polyesters, polyvinyl acetals, polyvinyl acetates, polystyrenes, polystyrene copolymers, polystyrene acrylates, styrene-butadiene block copolymers, alkylene-vinyl acetate and vinyl chloride copolymers, polyamides and copolymers thereof.

12. The composition according to claim 1, wherein the at least one polymer is selected from the group consisting of polyurethanes and polyacrylates.

13. The composition according to claim 1, wherein the at least one polymer is selected from the group consisting of cellulose derivatives, melamine and amino resins, polyalkylenes, polyimides, epoxy resins, polyurethanes, polyesters, polyvinyl acetals, polyvinyl acetates, polystyrenes, polystyrene copolymers, styrene-butadiene block copolymers, alkylene-vinyl acetate and vinyl chloride copolymers, polyamides and copolymers thereof.

14. The composition according to claim 1, wherein the at least one polymer is a polyurethane.

* * * * *